US010242942B2

(12) United States Patent
Manusharow et al.

(10) Patent No.: US 10,242,942 B2
(45) Date of Patent: Mar. 26, 2019

(54) INTEGRATED CIRCUIT PACKAGE SUBSTRATE (71) Applicants: Mathew J. Manusharow, Phoenix, AZ (US); Dustin P. Wood, Chandler, AZ (US); Debendra Mallik, Chandler, AZ (US)

(72) Inventors: Mathew J. Manusharow, Phoenix, AZ (US); Dustin P. Wood, Chandler, AZ (US); Debendra Mallik, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/127,708

(22) PCT Filed: Apr. 25, 2014

(86) PCT No.: PCT/US2014/035513
§ 371 (c)(1),
(2) Date: Sep. 20, 2016

(87) PCT Pub. No.: WO2015/163918
PCT Pub. Date: Oct. 29, 2015

(65) Prior Publication Data
US 2017/0154842 A1 Jun. 1, 2017

(51) Int. Cl.
H01L 23/48 (2006.01)
H01L 23/50 (2006.01)
(Continued)

(52) U.S. Cl.
CPC .......... H01L 23/50 (2013.01); G06F 17/5068 (2013.01); H01L 23/5226 (2013.01);
(Continued)

(58) Field of Classification Search
CPC ............ H01L 23/5226; H01L 23/5286; H01L 23/5381; H01L 23/5389; H01L 24/02;
(Continued)

(56) References Cited

U.S. PATENT DOCUMENTS 4,974,053 A 11/1990 Kinoshita et al.
2012/0248590 A1 10/2012 Liu et al.
(Continued)

FOREIGN PATENT DOCUMENTS

JP 2007042824 A 2/2007

OTHER PUBLICATIONS

Office Action dated Jul. 13, 2017 for Korean Application No. 2016-7026256, 5 pages.
(Continued)

Primary Examiner — Brook Kebede
(74) Attorney, Agent, or Firm — Schwabe, Williamson & Wyatt, P.C.

(57) ABSTRACT

Embodiments of the present disclosure are directed towards techniques and configurations for designing and assembling a die capable of being adapted to a number of different packaging configurations. In one embodiment an integrated circuit (IC) die may include a semiconductor substrate. The die may also include an electrically insulative material disposed on the semiconductor substrate; a plurality of electrical routing features disposed in the electrically insulative material to route electrical signals through the electrically insulative material; and a plurality of metal features disposed in a surface of the electrically insulative material. In embodiments, the plurality of metal features may be electrically coupled with the plurality of electrical routing features. In addition, the plurality of metal features may have an input/output (I/O) density designed to enable the die to be integrated with a plurality of different package con-
(Continued)

figurations. Other embodiments may be described and/or claimed.

17 Claims, 8 Drawing Sheets (51) Int. Cl.
*H01L 23/00* (2006.01)
*G06F 17/50* (2006.01)
*H01L 23/522* (2006.01)
*H01L 23/528* (2006.01)
*H01L 23/525* (2006.01)

(52) U.S. Cl.
CPC .......... *H01L 23/5286* (2013.01); *H01L 24/02* (2013.01); *H01L 24/06* (2013.01); *H01L 23/525* (2013.01); *H01L 23/5283* (2013.01); *H01L 24/13* (2013.01); *H01L 24/14* (2013.01); *H01L 24/16* (2013.01); *H01L 24/32* (2013.01); *H01L 24/48* (2013.01); *H01L 24/73* (2013.01); *H01L 24/81* (2013.01); *H01L 2224/02311* (2013.01); *H01L 2224/02373* (2013.01); *H01L 2224/02375* (2013.01); *H01L 2224/02381* (2013.01); *H01L 2224/0401* (2013.01); *H01L 2224/131* (2013.01); *H01L 2224/14133* (2013.01); *H01L 2224/16227* (2013.01); *H01L 2224/32225* (2013.01); *H01L 2224/48227* (2013.01); *H01L 2224/73204* (2013.01); *H01L 2224/81191* (2013.01); *H01L 2924/10252* (2013.01); *H01L 2924/10253* (2013.01); *H01L 2924/10329* (2013.01); *H01L 2924/10335* (2013.01); *H01L 2924/14* (2013.01); *H01L 2924/1431* (2013.01); *H01L 2924/1433* (2013.01); *H01L 2924/1434* (2013.01); *H01L 2924/157* (2013.01); *H01L 2924/1579* (2013.01); *H01L 2924/15311* (2013.01); *H01L 2924/15313* (2013.01); *H01L 2924/15787* (2013.01); *H01L 2924/15788* (2013.01)

(58) Field of Classification Search
CPC ......... H01L 24/19; H01L 24/24; H01L 24/73; H01L 24/92; H01L 25/50; H01L 25/165; H01L 21/563; H01L 21/568; H01L 23/50; H01L 23/367
USPC ............... 438/106, 108, 109, 612, 613, 617; 257/707, 737, 738, 774, 787, 796
See application file for complete search history.

(56) References Cited

U.S. PATENT DOCUMENTS

| | | | |
|---|---|---|---|
| 2013/0069212 A1 | 3/2013 | Araya | |
| 2013/0087909 A1* | 4/2013 | Abdul Razak | H01L 24/14 257/737 |
| 2013/0092935 A1 | 4/2013 | Wang et al. | |
| 2013/0273692 A1 | 10/2013 | McMillan et al. | |
| 2013/0313727 A1 | 11/2013 | Goh et al. | |
| 2014/0070380 A1 | 3/2014 | Chiu et al. | |
| 2015/0171015 A1* | 6/2015 | Mahajan | H01L 23/5381 257/712 |

OTHER PUBLICATIONS

International Search Report and Written Opinion dated Jan. 21, 2015 for International Application PCT/US2014/035513, 9 pages.
Decision to Refuse dated May 15, 2018 for Japanese Application No. 2017-507672, 7 pages.
Office Action dated Nov. 7, 2017 for Japanese Application No. 2017-507672, 4 pages.

* cited by examiner

INTEGRATED CIRCUIT PACKAGE SUBSTRATE

CROSS REFERENCE TO RELATED APPLICATIONS

The present application is a national phase entry under 35 U.S.C. § 371 of International Application No. PCT/US2014/035513, filed Apr. 25, 2014, entitled "INTEGRATED CIRCUIT PACKAGE SUBSTRATE", which designated, among the various States, the United States of America. The Specification of the PCT/US2014/035513 Application is hereby fully incorporated by reference.

FIELD

Embodiments of the present disclosure generally relate to the field of integrated circuits, and more particularly, to techniques and configurations for integrating a die with different package configurations.

BACKGROUND

In many cases, one integrated circuit (IC) die design may be used across multiple market segments. Each of these market segments may have different cost targets associated with them. However, under the current state of the art, the IC die may be limited to use with a single package or circuit board configuration. Because the IC die may be limited to a single package or circuit board configuration, the cost associated with utilizing the die in multiple market segments may need to include the cost of utilizing the package or circuit board configuration for which the die was designed. As a result, meeting margins in lower cost market segments may be difficult.

The background description provided herein is for the purpose of generally presenting the context of the disclosure. Unless otherwise indicated herein, the materials described in this section are not prior art to the claims in this application and are not admitted to be prior art by inclusion in this section.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure describe techniques and configurations for assembling an integrated circuit die capable of being adapted to a number of different packaging configurations. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group) and/or memory (shared, dedicated, or group) that execute one or more software or firmware programs, a combinational logic circuit, and/or other suitable components that provide the described functionality.

Figure 1:
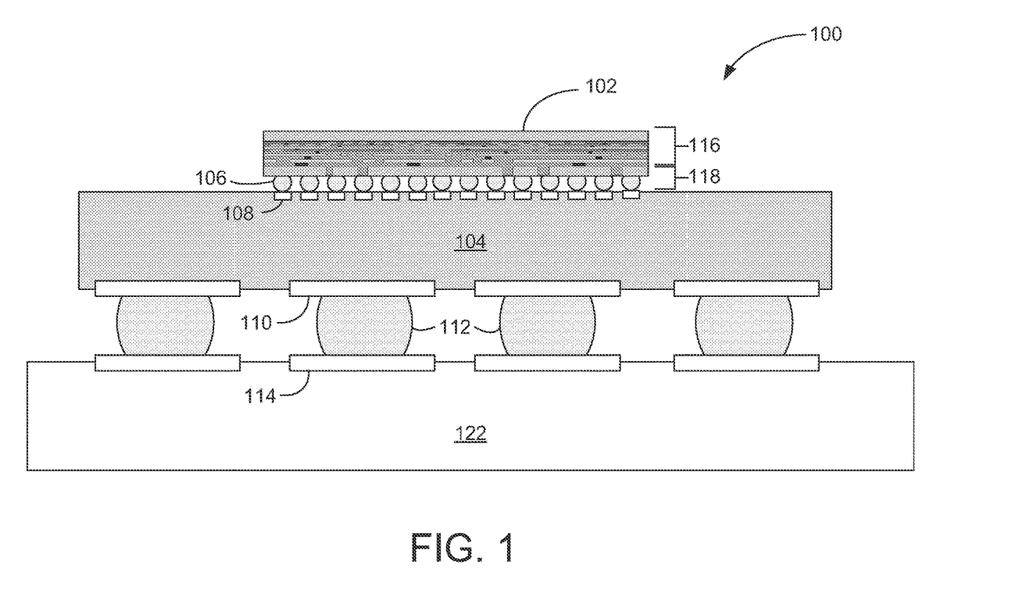
FIG. 1 schematically illustrates a cross-section side view of an example integrated circuit (IC) assembly, in accordance with various embodiments of the present disclosure.

FIG. 1 schematically illustrates a cross-section side view of an example integrated circuit (IC) assembly 100. In some embodiments, the IC assembly 100 may include one or more dies (e.g., IC die 102) electrically and/or physically coupled with a package substrate 104, as can be seen. The package substrate 104 may further be electrically coupled with a circuit board 122, as can be seen.

Die 102 may include a number of layers 116 from a silicon substrate up to a final layer common to a plurality of packaging technologies to enable die 102 to be adapted to a selected one of these packaging technologies. To accomplish this, one or more distribution layers 118 configured to adapt die 102 to a selected one of the plurality of packaging technologies, such as package substrate 104, may be disposed on layers 116. Die 102 can be attached to the package substrate 104 according to a variety of suitable configurations including, a flip-chip configuration, as depicted, or other configurations such as, for example, being embedded in the package substrate 104 or being configured in a wirebonding arrangement. In the flip-chip configuration, the die 102 may be attached to a surface of the package substrate 104 via die interconnect structures 106 such as bumps, pillars, or other suitable structures that may also electrically couple die 102 with the package substrate 104.

Die 102 may represent a discrete chip made from a semiconductor material and may be, include, or be a part of a processor, memory, or ASIC in some embodiments. In some embodiments, an electrically insulative material such as, for example, molding compound or underfill material (not pictured) may partially encapsulate a portion of the die 102 and/or interconnect structures 106. The die interconnect structures 106 may be configured to route the electrical signals between the die 102 and the package substrate 104.

The package substrate 104 may include electrical routing features configured to route electrical signals to or from die 102. The electrical routing features may include, for example, traces disposed on one or more surfaces of the package substrate 104 and/or internal routing features such as, for example, trenches, vias or other interconnect structures to route electrical signals through the package substrate 104. For example, in some embodiments, the package substrate 104 may include electrical routing features (such as die bond pads 108) configured to receive the die interconnect structures 106 and route electrical signals between the die 102 and the package substrate 104.

In some embodiments, the package substrate 104 is an epoxy-based laminate substrate having a core and/or build-up layers such as, for example, an Ajinomoto Build-up Film (ABF) substrate. The package substrate 104 may include other suitable types of substrates in other embodiments including, for example, substrates formed from glass, ceramic, or semiconductor materials.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Structures (not shown), for example, vias may be formed through the electrically insulating layers to route the electrical signals of the die 102 through the circuit board 122. The circuit board 122 may be composed of other suitable materials in other embodiments. In some embodiments, the circuit board 122 is a motherboard (e.g., motherboard 802 of FIG. 8).

Package-level interconnects such as, for example, solder balls 112 or land-grid array (LGA) structures may be coupled to one or more lands (hereinafter "lands 110") on the package substrate 104 and one or more pads 114 on the circuit board 122 to form corresponding solder joints that are configured to further route the electrical signals to between the package substrate 104 and the circuit board 122. Other suitable techniques to physically and/or electrically couple the package substrate 104 with the circuit board 122 may be used in other embodiments.

Figure 2:
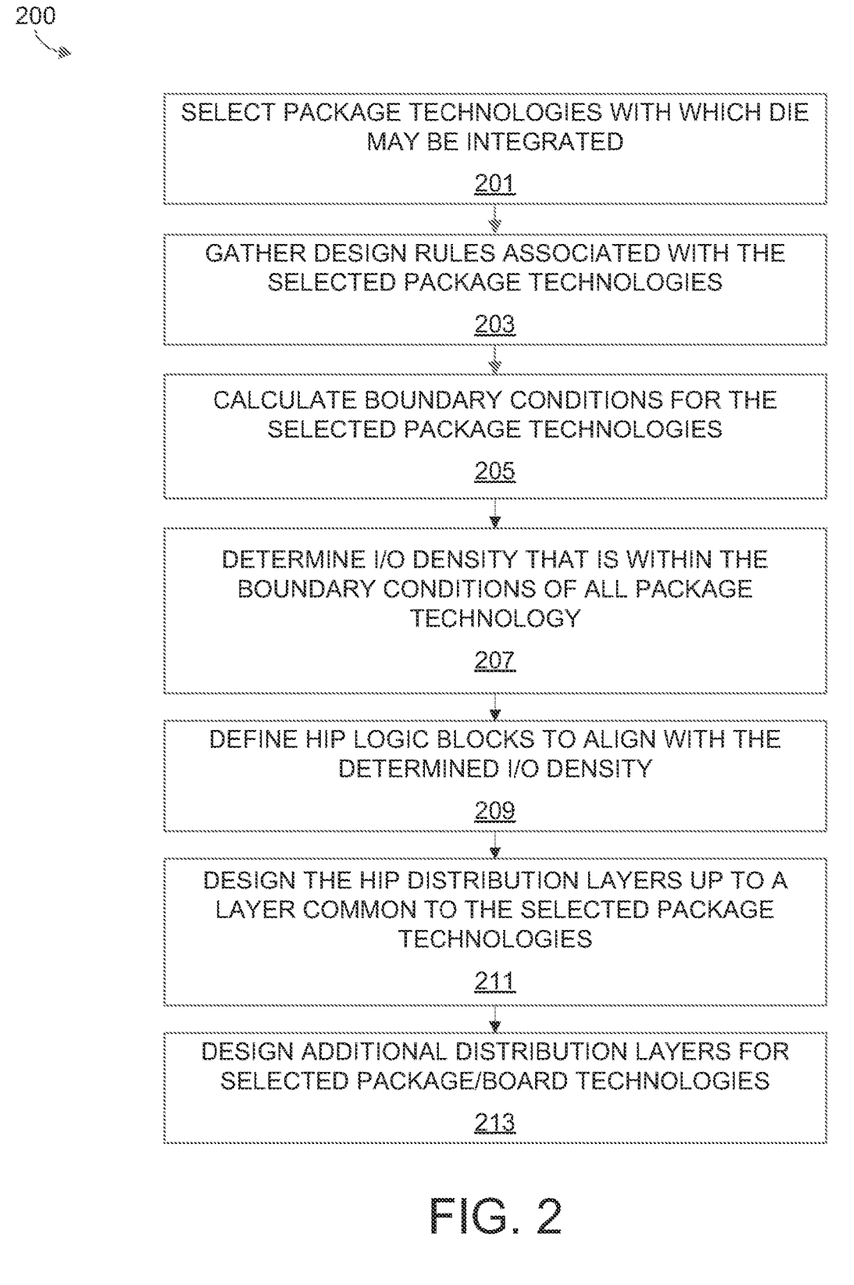
FIG. 2 is an illustrative an illustrative flow diagram of a portion of an IC die design process in accordance with various embodiments of the present disclosure.

FIG. 2 is an illustrative flow diagram of a portion of a die design process in accordance with various embodiments of the present disclosure. Process 200 may begin at block 201 where a number of different package technologies with which the IC die may be integrated may be selected. As used herein, packaging technologies and packaging configurations may be used synonymously unless the context clearly indicates otherwise. Dies adapted to Illustrative package technologies are depicted in blocks 302-310 of FIG. 3, however, this disclosure is not to be limited to only the package technologies depicted herein. Any package technology including flip-chip, fan-in or fan-out wafer level packaging, direct chip attach packaging, or any other suitable packaging technology is contemplated by this disclosure.

The process may then proceed to block 203 where design rules associated with the selected package technologies may be gathered. In embodiments, these design rules may include bump pitch, line/space, and/or layer count. At block 205 the design rules may be utilized to calculate boundary conditions for the selected package technologies. These boundary conditions may, in some embodiments, define an input/output (I/O) density the package technology is capable of achieving. At block 207, an I/O density that is within the boundary conditions of each package technology may be determined. In embodiments, this may be a single I/O density to be utilized for all package technologies. In other embodiments, an I/O density may be selected such that a multiple of that I/O density is to be utilized for each of the package technologies. For example, an I/O density of 12.5 I/O per millimeter (mm) may be adapted to 25 I/O per mm, 37.5 I/O per mm, etc. These greater densities may be achieved by integrating multiple hard intellectual property (HIP) I/O blocks into the IC die. The HIP I/O blocks are discussed further below. Because the boundary conditions, and the resulting I/O density, are based on the design rules associated with the selected packaging technologies, the IC die may be adapted to each packaging technology, or configuration, without any changes to the design rules or manufacturability of the packaging technology.

Once an I/O density has been determined, the process may proceed to block 209 where HIP I/O blocks may be defined to align with the determined I/O density. As used herein, a HIP I/O block may refer to an analog circuit, I/O circuit, or logic circuit implemented in a layer of transistors in the IC die. A HIP I/O block may also be referred to in the industry as a hard IP core. A HIP I/O block may include logic circuits that have been validated and may be used to design logic placement on die. A HIP I/O block may also be stored in a catalog, or library, of HIP I/O blocks. At block 211 HIP distribution layers may be designed up to a final layer common to the selected package technologies. The HIP distribution layers may be configured to route signals through the die to and from the HIP I/O blocks. At block 213 additional distribution layers may be designed that, when disposed on the final layer common to the selected package technologies, adapts the die to be integrated with a selected one of the package technologies. As a result, the die up to the final layer common to the selected package technologies may be used across the selected package technologies with only the addition of the additional distribution layers for the selected package technologies.

In some embodiments, a HIP I/O block defined to align with a determined I/O density may be integrated in a number of different IC die configurations with other HIP I/O blocks having a similarly defined I/O density. In this way, a HIP I/O block defined to align with a determined I/O density may be interchangeable with other HIP I/O blocks having a similarly defined I/O density. For instance, a HIP I/O block defined to align with an I/O density of, for example, 25 I/O per mm may be integrated with one set of HIP I/O blocks in one IC die and a different set of HIP I/O blocks in another IC die, where the one set and the different set of I/O blocks are also defined to align with an I/O density of 25 I/O per mm. As such, both the one IC die and the another IC die may be able to satisfy the design rules of a plurality of selected package technologies.

Figure 3:
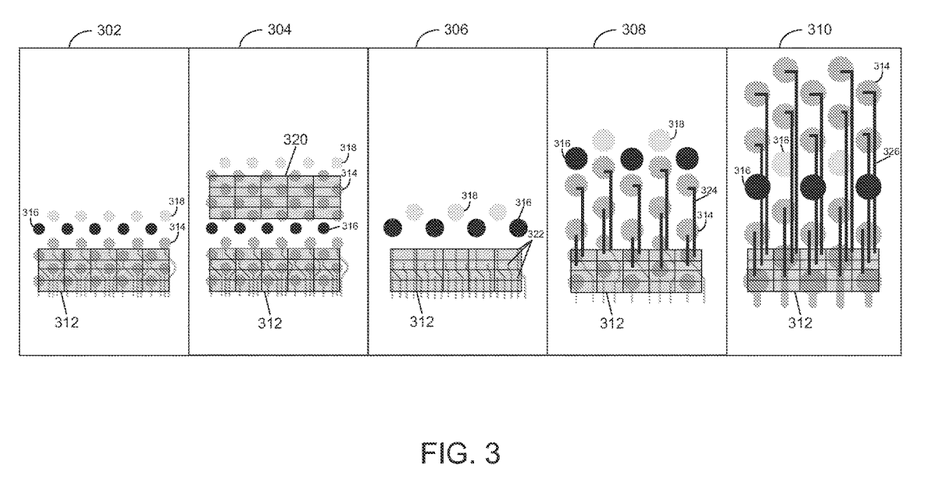
FIG. 3 is an illustrative view of a single die implemented in a variety of configurations, in accordance with various embodiments of the present disclosure.

FIG. 3 is an illustrative view of a HIP block 312 implemented in a die adapted to a variety of packaging configurations, in accordance with various embodiments of the present disclosure. As depicted, HIP block 312 may include one or more HIP I/O blocks and HIP distribution layers, such as those discussed in reference to FIG. 2. As depicted, HIP block 312 is configured to provide an I/O density of 25 I/O per mm. This I/O density is merely an example I/O density that may be determined as described in reference to FIG. 2. Any I/O density may be utilized without departing from the scope of this disclosure. In addition, the HIP I/O block and HIP distribution layers may be defined and designed as described in reference to FIG. 2.

Each of dies 302-310 illustrates HIP Block 312, adapted to be integrated with a different package configuration. Block 302 shows HIP block 312 adapted for integration with a flip-chip ball grid array (FCBGA) configuration. This is accomplished through the integration of bumps 314-318 where bumps 314 provide for the escape of signals from HIP block 312, while bumps 318 and 316 provide for power and ground, respectively. Die 304 depicts two identical HIP blocks 312 and 320 coupled with one another in a ball grid array configuration. Because each HIP block has an I/O density of 25 I/O per mm, the integration of the two HIP blocks 312 and 320 provides die 304 with an effective I/O density of 50 I/O per mm.

Die 306 demonstrates HIP block 312 adapted to be integrated with a flip-chip chip scale package (FCCSP) having a line to line, or bond on line, packaging configuration where bumps 318 and 316 still provide for power and ground to the HIP Block, but traces 322 provide for signal escape rather than the bumps 314 depicted in dies 302, 304, 308, and 310. Die 308 depicts HIP block 312 adapted to be integrated with a FCCSP configuration utilizing bumps 314 in place of the traces depicted in die 306. To accomplish this, a redistribution layer (RDL) 324, has been integrated with HIP block 312. Finally, die 310 depicts HIP block 312 adapted to a direct chip attach configuration through the addition of a RDL 326.

These package configurations are example package configurations meant to be illustrative only. Any selection and/or number of packaging configurations are contemplated by this disclosure.

Figure 4:
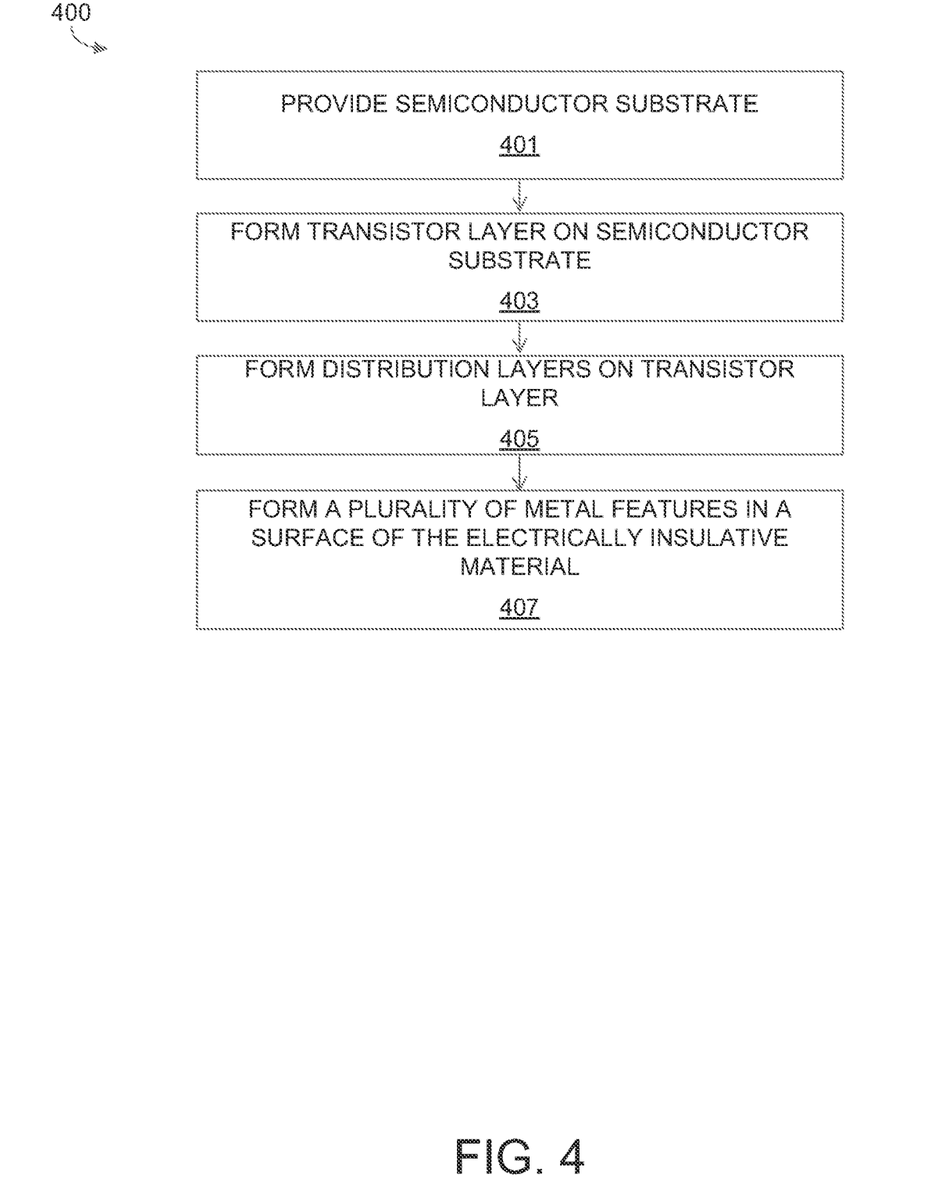
FIG. 4 is an illustrative flow diagram of a die assembly process in accordance with various embodiments of the present disclosure.
Figure 5:
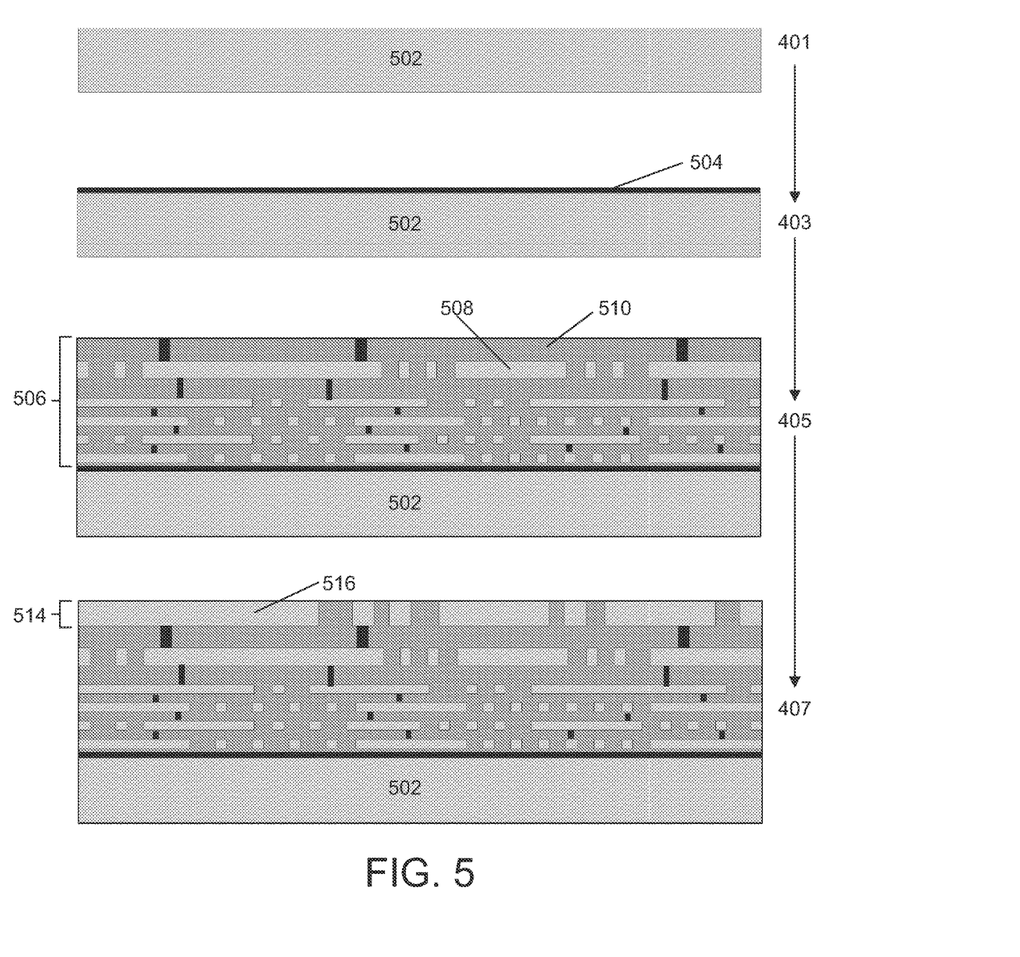
FIG. 5 is an illustrative cross-sectional view of selected procedures in a die assembly process in accordance with various embodiments of the present disclosure.

FIG. 4 is an illustrative flow diagram of a die fabrication process 400 for assembling a die capable of being adapted to a number of different package configurations in accordance with an embodiment of the present disclosure. FIG. 5 provides cross-sectional views of selected operations illustrating stages in the package substrate fabrication process 400, in accordance with an illustrative embodiment.

Process 400 may begin at operation 401 where a semiconductor substrate (e.g., semiconductor substrate 502 of FIG. 5) may be provided. The semiconductor substrate may include materials such as silicon, silicon dioxide, aluminum oxide, sapphire, germanium, gallium arsenide, an alloy of silicon and germanium, and/or indium phosphide.

At operation 403 a layer of transistors may be formed on the semiconductor substrate (e.g., transistor layer 504 of FIG. 5). In embodiments, this layer of transistors may form one or more HIP I/O blocks. The layers of transistors may be formed in any conventional way, such as through a photolithography process, for example.

At operation 405 distribution layers (e.g., distribution layers 506 of FIG. 5) may be formed on the layer of transistors. The distribution layers may be configured to route signals to and from the layer of transistors. In embodiments, the distribution layers may be formed by depositing one or more layers of electrically insulative material (e.g., insulative material 510 of FIG. 5), such as, a dielectric material or molding compound. One or more electrical routing features (e.g., electrical routing feature 508 of FIG. 5) may be formed in the electrically insulative material to route electrical signals to and from the layer of transistors. These electrical routing features may comprise copper, or an alloy thereof, or any other suitably conductive material.

At operation 407 a plurality of metal features (e.g., metal feature 516 of FIG. 5) may be formed in a surface of the electrically insulative material. These electrical routing features may form a layer common to a plurality of different package configurations (e.g., layer 514 of FIG. 5) such that additional layers may be disposed on top of this common layer to adapt the die to individual package technologies. This final common layer may have an I/O density such as that determined in FIG. 2. In embodiments where the transistor layer forms one or more HIP I/O blocks, the distribution layers may be HIP distribution layers, such as those discussed in reference to FIG. 2.

Figure 6:
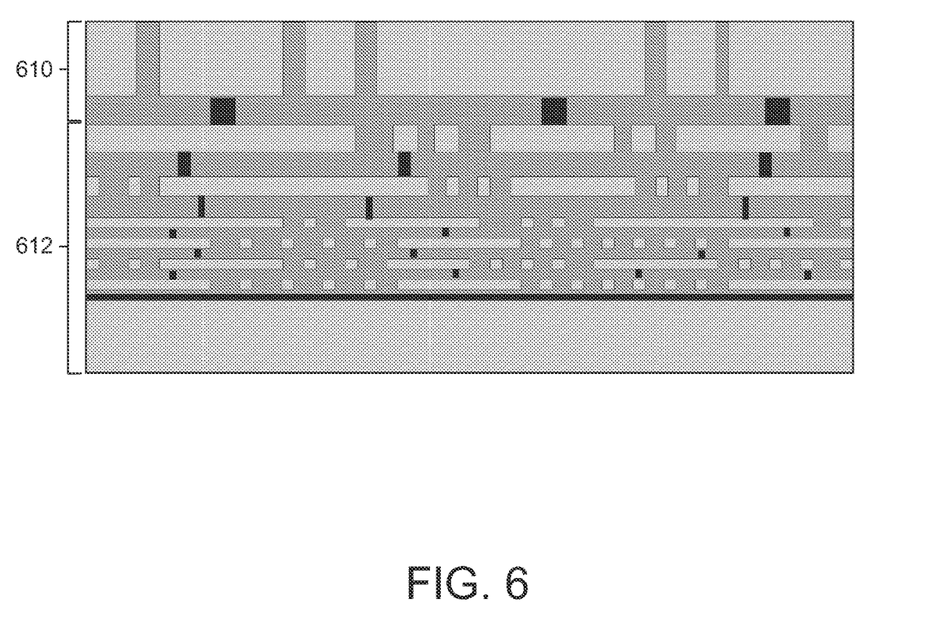
FIG. 6 is an illustrative cross-sectional view of a die adapted to an example package configuration.

FIG. 6 is an illustrative cross-sectional view of a die fabricated through the process described in reference to FIGS. 4 and 5 adapted to an example package configuration. As depicted, the die produced through the fabrication process may be fabricated up to a layer common to a plurality of package technologies as depicted by block 612. This common layer may have one or more additional layers, such as redistribution layer (RDL) 610 formed thereon to adapt the die to a selected one of the different package technologies. While depicted here as a RDL, this is merely meant to be illustrative, any layers configured to conform the die to a selected packaging technology may be utilized to adapt the block 612 to the selected packaging technology. These layers may include interconnect structures such as bumps, pillars, or solder balls. In addition, these layers may include a plurality of traces, such as those described in reference to die 306 of FIG. 3, for a line to line packaging configuration.

Figure 7:
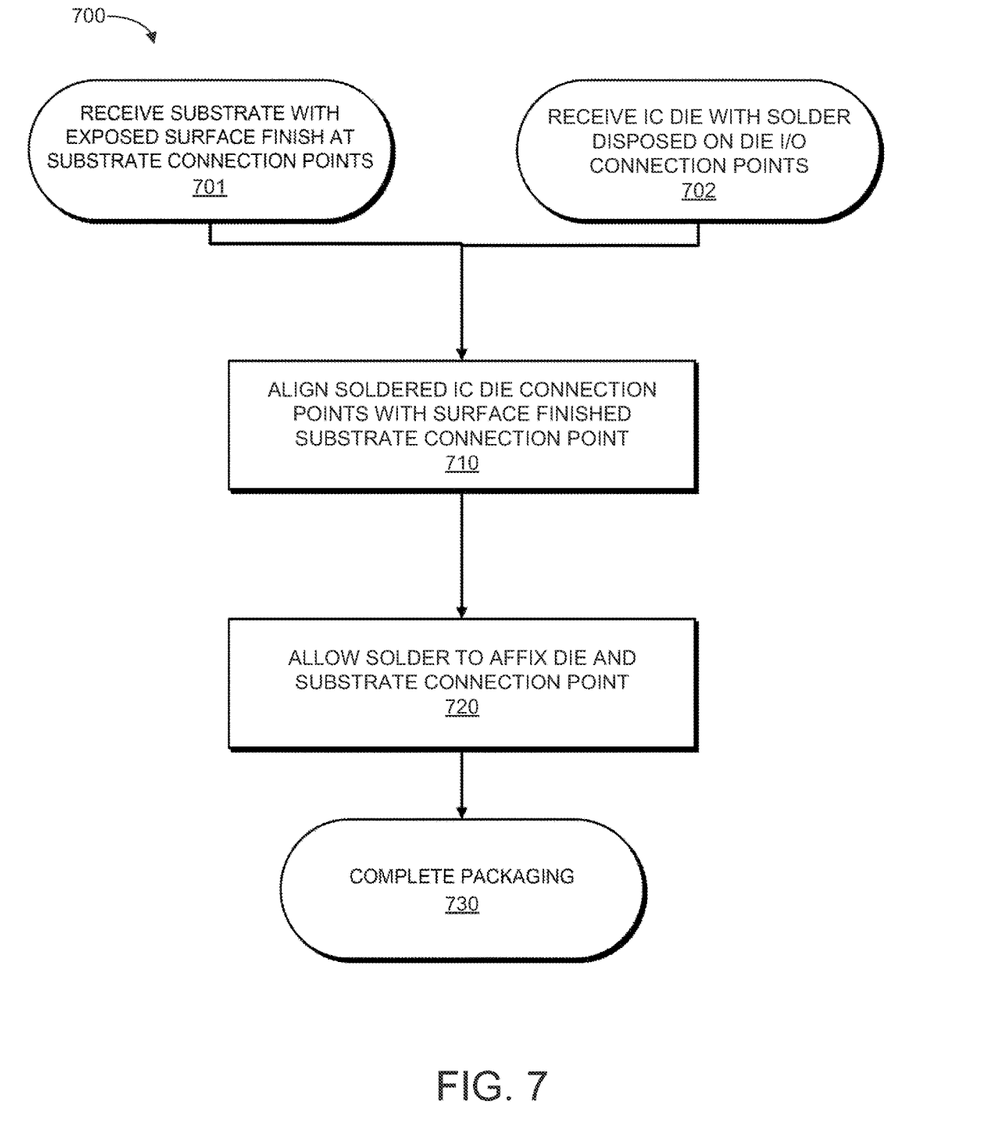
FIG. 7 is an illustrative flow diagram of an assembly process utilizing a die in accordance with an embodiment of the present disclosure.

FIG. 7 is an illustrative flow diagram of an assembly process 700 utilizing an IC die in accordance with an embodiment of the present disclosure. Such an IC die may be designed through the illustrative method described in reference to FIG. 2, above, and produced through the illustrative method described in reference to FIG. 4, above, and depicted in FIG. 5.

Assembly process 700 begins at operation 701 with receiving a package substrate (e.g., package substrate 104 of FIG. 1) with exposed surface finish at predetermined substrate connection points. As such, in the illustrative embodiments, no solder resist is present on the surface of the package substrate and no solder is placed on the surface finish prior to coupling a chip to the package substrate.

At operation 702, an IC die may be received with solder bumps disposed on the die connection points. While the IC die may generally be of any conventional type, in a particular embodiment, the IC die may be a processor, such as a microprocessor, having a large I/O count. At operation 710, the IC die may be aligned with the surface finished substrate to have the soldered IC die connection points aligned with the surface finished substrate connection points. The die side solder is then alloyed at operation 720 to affix the die to the substrate connection points which completes the packaging 730.

Figure 8:
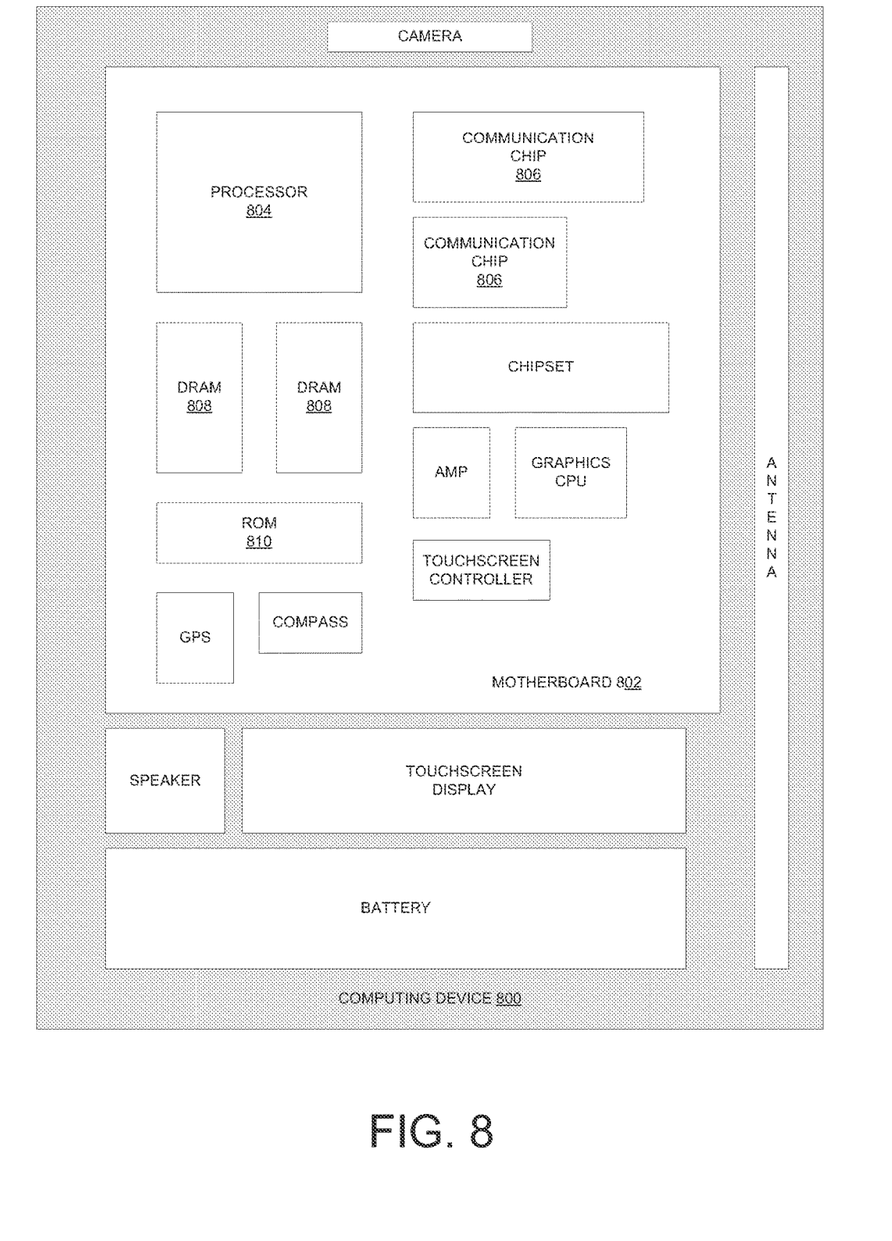
FIG. 8 schematically illustrates a computing device that includes a package substrate having a dual surface finish, in accordance with some embodiments.

Embodiments of the present disclosure may be implemented into a system using any suitable hardware and/or software to configure as desired. FIG. 8 schematically illustrates a computing device that includes a die as described herein, in accordance with some embodiments. The computing device 800 may house a board such as motherboard 802. The motherboard 802 may include a number of components, including but not limited to a processor 804 and at least one communication chip 806. The processor 804 may be physically and electrically coupled to the motherboard 802. In some implementations, the at least one communication chip 806 may also be physically and electrically coupled to the motherboard 802. In further implementations, the communication chip 806 may be part of the processor 804.

Depending on its applications, computing device 800 may include other components that may or may not be physically and electrically coupled to the motherboard 802. These other components may include, but are not limited to, volatile memory (e.g., dynamic random access memory (DRAM) 808), non-volatile memory (e.g., read only memory (ROM) 810), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 806 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 806 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 806 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 806 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 806 may operate in accordance with other wireless protocols in other embodiments.

The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, EV-DO, and others.

The processor 804 of the computing device 800 may be packaged in an IC assembly (e.g., IC assembly 100 of FIG. 1) that includes a package substrate as described herein. For example, the circuit board 122 of FIG. 1 may be a motherboard 802 and the processor 804 may be a die 102 mounted on a package substrate 104 as described herein. The package substrate 104 and the motherboard 802 may be coupled together using package-level interconnects as described herein. The term "processor" may refer to any device or portion of a device that processes electronic data from registers and/or memory to transform that electronic data into other electronic data that may be stored in registers and/or memory.

The communication chip 806 may also include a die (e.g., die 102 of FIG. 1) that may be packaged in an IC assembly (e.g., IC assembly 100 of FIG. 1) that includes a package substrate 104 as described herein. In further implementations, another component (e.g., memory device or other integrated circuit device) housed within the computing device 800 may include a die (e.g., die 102 of FIG. 1) that may be packaged in an IC assembly (e.g., IC assembly 100 of FIG. 1) that includes a package substrate 104 as described herein.

In addition, computing device 800 may include one or more computer readable media, such as DRAM 808 or ROM 810. These computer readable media may have instructions stored thereon, which when executed by processor 804 may cause computing device 800 to perform any of the processes described herein, such as the process described in reference to FIG. 2, above.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

EXAMPLES

According to various embodiments, the present disclosure describes a number of examples. Example 1 is an integrated circuit (IC) die comprising: a semiconductor substrate; an electrically insulative material disposed on the semiconductor substrate; a plurality of electrical routing features disposed in the electrically insulative material to route electrical signals through the electrically insulative material; and a plurality of metal features coupled with the plurality of electrical routing features, wherein the plurality of metal features have an input/output (I/O) density designed to enable the die to be integrated with a plurality of different package configurations.

Example 2 may include the subject matter of Example 1, further comprising a transistor layer disposed between the substrate and the electrically insulative material, the transistor layer forming one or more hard intellectual property (HIP) input/output (I/O) blocks, wherein the plurality of electrical routing features are HIP routing features to route electrical signals from the plurality of metal features through the electrically insulative material to the one or more HIP I/O blocks.

Example 3 may include the subject matter of Example 2, wherein the one or more HIP I/O blocks comprise respective logic circuits.

Example 4 may include the subject matter of Example 2, wherein the one or more HIP I/O blocks are designed to align with the I/O density.

Example 5 may include the subject matter of any one of Examples 1-4, wherein the I/O density is based, at least in part, on one or more boundary conditions respectively associated with each package configuration of the plurality of different package configurations.

Example 6 may include the subject matter of any one of Examples 1-4, further comprising a plurality of interconnect structures disposed on the die, the plurality of interconnect structures coupled with the plurality of metal features, wherein the interconnect structures are to electrically couple the die with a selected one of the plurality of different package configurations.

Example 7 may include the subject matter of Example 6, wherein the plurality of interconnect structures are coupled with one or more redistribution layers (RDLs) that electrically couple the plurality of interconnect structures with the plurality of metal features.

Example 8 may include the subject matter of Example 6, wherein the plurality of interconnect structures comprise one or more of pillars, bumps, or solder balls.

Example 9 may include the subject matter of any one of Examples 1-4, wherein the plurality of different package configurations includes one or more direct chip attach (DCA) circuit board configurations.

Example 10 may include the subject matter of any one of Examples 1-4, wherein each individual package configuration, of the plurality of package configurations, has an associated I/O density of the individual package configuration, and wherein the associated I/O density of the individual packages vary.

Example 11 is a method of assembling an integrated circuit (IC) die comprising: providing a semiconductor substrate; depositing an electrically insulative material on the semiconductor substrate; forming a plurality electrical routing features in the electrically insulative material to route electrical signals through the electrically insulative material; and forming a plurality of metal coupled with the plurality of electrical routing features, wherein the plurality of metal features have an input/output (I/O) density designed to enable the die to be integrated with a plurality of different package configurations.

Example 12 may include the subject matter of Example 11, further comprising forming one or more hard intellectual property (HIP) I/O blocks by forming a layer of transistors on the semiconductor substrate prior to depositing the electrically insulative materials, wherein the plurality of electrical routing features route electrical signals from the plurality of metal features through the electrically insulative material to the one or more HIP I/O blocks.

Example 13 may include the subject matter of Example 12, further comprising designing the one or more HIP I/O blocks to align with the I/O density.

Example 14 may include the subject matter of Example 12, further comprising calculating one or more boundary conditions respectively associated with each package configuration of the plurality of different package configurations, wherein design of the I/O density is based, at least in part, on the one or more boundary conditions respectively associated with each package configuration of the plurality of different package configurations.

Example 15 may include the subject matter of Example 14, wherein calculating the one or more boundary conditions respectively associated with each package configuration is based on one or more design rules associated with each package configuration of the plurality of different package configurations.

Example 16 may include the subject matter of Example 15, wherein the design rules include at least one or more of a bump pitch, line spacing, or layer count.

Example 17 may include the subject matter of any one of Examples 11-16, further comprising depositing a plurality of interconnect structures on a surface of the die, the plurality of interconnect structures being coupled with the plurality of metal features, wherein the interconnect structures electrically couple the die with a selected one of the plurality of different package configurations.

Example 18 may include the subject matter of Example 17, wherein depositing the plurality of interconnect structures further comprises depositing one or more redistribution layers (RDLs), the one or more RDLs being electrically coupled with the plurality of interconnect structures.

Example 19 may include the subject matter of any one of Examples 11-16, wherein the plurality of different package configurations includes one or more direct chip attach (DCA) circuit board configurations.

Example 20 is a package assembly comprising: a package substrate; and an integrated circuit (IC) die including: a semiconductor substrate; a transistor layer disposed on the semiconductor substrate forming one or more hard intellectual property (HIP) I/O blocks; an electrically insulative material disposed on the transistor layer; a plurality of electrical routing features disposed in the electrically insulative material to route electrical signals to and from the HIP I/O blocks through the electrically insulative material; a plurality of metal features coupled with the plurality of electrical routing features, wherein the plurality of metal features have an input/output (I/O) density designed to enable the die to be integrated with a plurality of different package configurations, and wherein the HIP I/O blocks are designed to align with the I/O density; and a plurality of interconnect structures disposed on the die, the plurality of interconnect structures coupled with the plurality of metal features, wherein the interconnect structures electrically couple the IC die with the package substrate.

Example 21 may include the subject matter of Example 20, wherein the IC die is a processor.

Example 22 may include the subject matter of Example 20, further comprising one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board, wherein the package assembly is part of a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder.

Example 23 is one or more computer-readable storage media having instructions stored thereon which, when executed by a processor of a computing device, cause the computing device to: accept input from a user of the computing device, the input indicating a plurality of different package configurations for an integrated circuit (IC) die; calculate one or more boundary conditions for each of the package configurations based, at least in part, on respective design rules associated with each package configuration; and determine an input/out (I/O) density for each package.

Example 24 may include the subject matter of Example 23, wherein the design rules include one or more of a bump pitch, line spacing, or row count.

Example 25 may include the subject matter of Example 23, wherein the instructions, when executed by a processor of the computing device, cause the computing device to define one or more hard intellectual property (HIP) blocks that align with the I/O density.

Example 26 is a computing device comprising: means for accepting input from a user of the computing device, the input indicating a plurality of different package configurations for an integrated circuit (IC) die; means for calculating one or more boundary conditions for each of the package configurations based, at least in part, on respective design rules associated with each package configuration; and means for determining an input/out (I/O) density for each package.

Example 27 may include the subject matter of Example 26, wherein the design rules include one or more of a bump pitch, line spacing, or row count.

Example 28 may include the subject matter of Example 26, further comprising means for defining one or more hard intellectual property (HIP) blocks that align with the I/O density.

Example 29 is a computer implemented method comprising: accepting, by a computing device, input from a user of the computing device, the input indicating a plurality of different package configurations for an integrated circuit (IC) die; calculating, by the computing device, one or more boundary conditions for each of the package configurations based, at least in part, on respective design rules associated with each package configuration; and determining, by the computing device, an input/out (I/O) density for each package.

Example 30 may include the subject matter of Example 29, wherein the design rules include one or more of a bump pitch, line spacing, or row count.

Example 31 may include the subject matter of Example 29, further comprising defining one or more hard intellectual property (HIP) blocks that align with the I/O density.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

For the purposes of this description, a computer-usable or computer-readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit (IC) die comprising:
   a semiconductor substrate;
   an electrically insulative material disposed on the semiconductor substrate;
   a plurality of electrical routing features disposed in the electrically insulative material to route electrical signals through the electrically insulative material;
   a plurality of metal features coupled with the plurality of electrical routing features, wherein the plurality of metal features have an input/output (I/O) density designed to enable the die to be integrated with a plurality of different package configurations; and a transistor layer disposed between the substrate and the electrically insulative material, the transistor layer forming one or more hard intellectual property (HIP) input/output (I/O) blocks, wherein the plurality of electrical routing features are HIP routing features to route electrical signals from the plurality of metal features through the electrically insulative material to the one or more HIP I/O blocks.

2. The IC die of claim 1, wherein the one or more HIP I/O blocks comprise respective logic circuits.

3. The IC die of claim 1, wherein the one or more HIP I/O blocks are designed to align with the I/O density.

4. The IC die of claim 1, wherein the I/O density is based, at least in part, on one or more boundary conditions respectively associated with each package configuration of the plurality of different package configurations.

5. The IC die of claim 1, further comprising a plurality of interconnect structures disposed on the die, the plurality of interconnect structures coupled with the plurality of metal features, wherein the interconnect structures are to electrically couple the die with a selected one of the plurality of different package configurations.

6. The IC die of claim 5, wherein the plurality of interconnect structures are coupled with one or more redistribution layers (RDLs) that electrically couple the plurality of interconnect structures with the plurality of metal features.

7. The IC die of claim 5, wherein the plurality of interconnect structures comprise one or more of pillars, bumps, or solder balls.

8. The IC die of claim 1, wherein the plurality of different package configurations includes one or more direct chip attach (DCA) circuit board configurations.

9. The IC die of claim 1, wherein each individual package configuration, of the plurality of different package configurations, has an associated I/O density of the individual package configuration, and wherein the associated I/O densities of the individual packages vary.

10. A method of assembling an integrated circuit (IC) die comprising:
providing a semiconductor substrate;
depositing an electrically insulative material on the semiconductor substrate;
forming a plurality electrical routing features in the electrically insulative material to route electrical signals through the electrically insulative material;
forming a plurality of metal features coupled with the plurality of electrical routing features, wherein the plurality of metal features have an input/output (I/O) density designed to enable the die to be integrated with a plurality of different package configurations; and
forming one or more hard intellectual property (HIP) I/O blocks by forming a layer of transistors on the semiconductor substrate prior to depositing the electrically insulative materials, wherein the plurality of electrical routing features route electrical signals from the plurality of metal features through the electrically insulative material to the one or more HIP I/O blocks.

11. The method of claim 10, further comprising designing the one or more HIP I/O blocks to align with the I/O density.

12. The method of claim 10, further comprising calculating one or more boundary conditions respectively associated with each package configuration of the plurality of different package configurations, wherein design of the I/O density is based, at least in part, on the one or more boundary conditions respectively associated with each package configuration of the plurality of different package configurations.

13. The method of claim 12, wherein calculating the one or more boundary conditions respectively associated with each package configuration is based on one or more design rules associated with each package configuration of the plurality of different package configurations.

14. The method of claim 13, wherein the design rules include at least one or more of a bump pitch, line spacing, or layer count.

15. The method of claim 10, further comprising depositing a plurality of interconnect structures on a surface of the die, the plurality of interconnect structures being coupled with the plurality of metal features, wherein the interconnect structures electrically couple the die with a selected one of the plurality of different package configurations.

16. The method of claim 15, wherein depositing the plurality of interconnect structures further comprises depositing one or more redistribution layers (RDLs), the one or more RDLs being electrically coupled with the plurality of interconnect structures.

17. The method of claim 10, wherein the plurality of different package configurations includes one or more direct chip attach (DCA) circuit board configurations.

* * * * *